(12) United States Patent
Liu et al.

(10) Patent No.: US 9,952,693 B2
(45) Date of Patent: Apr. 24, 2018

(54) TOUCH PANEL

(71) Applicant: TPK Touch Solutions Inc., Taipei (TW)

(72) Inventors: Chen-Yu Liu, Taoyuan (TW); Li-Wei Kung, Taoyuan (TW); Hsi-Chien Lin, Hsinchu (TW)

(73) Assignee: TPK Touch Solutions Inc., Taipei (TW)

( * ) Notice: Subject to any disclaimer, the term of this patent is extended or adjusted under 35 U.S.C. 154(b) by 0 days.

(21) Appl. No.: 15/401,533

(22) Filed: Jan. 9, 2017

(65) Prior Publication Data

US 2017/0115764 A1 Apr. 27, 2017

Related U.S. Application Data

(63) Continuation of application No. 14/511,148, filed on Oct. 9, 2014, now Pat. No. 9,543,365.

(30) Foreign Application Priority Data

Oct. 9, 2013 (CN) .......................... 2013 1 0468936

(51) Int. Cl.
| | |
|---|---|
| *H01L 29/08* | (2006.01) |
| *H01L 35/24* | (2006.01) |
| *H01L 51/00* | (2006.01) |
| *G06F 3/041* | (2006.01) |
| *H01L 27/32* | (2006.01) |
| *B32B 27/06* | (2006.01) |
| *G06F 3/044* | (2006.01) |

(52) U.S. Cl.
CPC .............. *G06F 3/041* (2013.01); *B32B 27/06* (2013.01); *G06F 3/044* (2013.01); *H01L 27/323* (2013.01); *B32B 2307/412* (2013.01); *B32B 2457/208* (2013.01); *G06F 2203/04103* (2013.01); *G06F 2203/04111* (2013.01)

(58) Field of Classification Search
CPC combination set(s) only.
See application file for complete search history.

(56) References Cited

U.S. PATENT DOCUMENTS

| | | | | |
|---|---|---|---|---|
| 2005/0218397 A1* | 10/2005 | Tran | ...................... | B82Y 10/00 257/14 |
| 2005/0218398 A1* | 10/2005 | Tran | ...................... | B82Y 10/00 257/14 |
| 2005/0230822 A1* | 10/2005 | Tran | ...................... | G11C 13/02 257/735 |
| 2005/0231855 A1* | 10/2005 | Tran | ...................... | G11C 11/54 360/324.1 |
| 2007/0285843 A1* | 12/2007 | Tran | ...................... | B82Y 10/00 360/245.9 |

FOREIGN PATENT DOCUMENTS

KR             100762787 B1 * 10/2007

* cited by examiner

*Primary Examiner* — Telly Green
(74) *Attorney, Agent, or Firm* — Paul David Bendemire

(57) ABSTRACT

The present invention provides a touch panel, including a lower substrate, an organic light-emitting component, disposed on the lower substrate, a nano silver sensing layer, disposed on the organic light emitting component, and an upper substrate, disposed on the nano silver sensing layer.

16 Claims, 6 Drawing Sheets

TOUCH PANEL

RELATED APPLICATIONS

The current application is a continuation of U.S. application Ser. No. 14/511,148, filed on Oct. 9, 2014, which claims priority of China Patent Application No. CN 201310468936.2, filed on Oct. 9, 2013. The entire contents of the above-referenced applications are incorporated herein by reference.

FIELD OF THE INVENTION

The present invention relates to the field of touch input technologies and more particularly to a touch panel.

BACKGROUND

Nowadays, personal digital assistants (PDA), mobile phones, notebook computers, tablet PCs and other portable electronic products are commonly used in modern life. Since these electronic products need to be thinner and lighter, the traditional input devices, such as keyboards or mice have to be replaced with other input devices. In addition, the needs for tablet PCs has greatly increased, hence the touch panel technology has became one of the key components in electronic products. Besides, the organic light emitting display (OLED) has some advantages such as thinning, low weight, low power consumption, high brightness, high response speed, so it also commonly used in mobile electronic devices.

In the technology of combining the touch panel and the OLED, usually, the touch panel and the OLED are formed separately in individual processes, and then combined with each other. The OLED provides the function for displaying, and the touch panel provides the function for interacting with the user. The position data detected by the touch panel and displaying data of the OLED are connected to each other and then calculated through the outside traces and the operation systems. Therefore the touch panel becomes heavy and thick, and is hardly able to achieve the lightened and thinned requirements. Besides, PET (polyethylene terephthalate) is usually used as the substrate of a large-size touch panel, but some common materials for forming the electrodes such as indium tin oxide (ITO) are fragile and not suitable for forming on the flexible PET film. In addition, some issues such as PET substrate can't endure high temperatures, or the conductivity of the ITO electrode can't satisfy the rapid scanning requirements of the large-size touch panel still need to be resolved.

SUMMARY OF THE INVENTION

The present invention provides a touch panel, comprising a lower substrate, an organic light-emitting component, disposed on the lower substrate, a nano silver sensing layer, disposed on the organic light emitting component, and an upper substrate, disposed on the nano silver sensing layer.

In one embodiment of the present invention, the nano silver sensing layer comprises: a first insulating layer, disposed on the organic light emitting component, a first nano silver electrode layer, disposed on the surface of the first insulating layer, a second insulating layer, disposed on the first nano silver electrode layer, and a second nano silver electrode layer, disposed on the surface of the second insulating layer.

In one embodiment of the present invention, the first insulating layer and the second insulating layer are composed of flexible materials, and the flexible materials are selected from a group consisting of epoxy, modified epoxy, polyester, acrylic, fluorocarbon polymers, polyphenylene oxide, polyimide, phenolic resins, polysulfones, silicone-polymer resin, BT resin, cyanate poly polyethylene, polycarbonate resin, acrylonitrile-butadiene-styrene copolymer, polyethylene terephthalate, polyethylene terephthalate, polybutylene terephthalate, liquid crystal polymers, polyamides, nylon 6, copolymerized formaldehyde, polyphenylene sulfide and cyclic olefin copolymer.

In one embodiment of the present invention, the touch panel further comprises a transparent adhesion layer disposed between the organic light emitting component and the first insulating layer.

In one embodiment of the present invention, the first nano silver electrode layer includes a plurality of first electrodes, the second nano silver electrode layer includes a plurality of second electrodes, the first electrodes and the second electrodes are crossed to each other.

In one embodiment of the present invention, the touch panel further comprises a plurality of protection layers disposed on the first nano silver electrode layer and the second nano silver electrode layer respectively, wherein each protection layer includes a plurality of via holes to expose parts of each first electrode and parts of each second electrode.

In one embodiment of the present invention, the touch panel further comprises a plurality of traces, each trace electrically connected to one first electrode or one second electrode through the via holes.

In one embodiment of the present invention, the nano silver sensing layer comprises: a third insulating layer, disposed on the organic light emitting component, wherein the third insulating layer has a lower surface closer to the organic light emitting component, and the third insulating layer has an upper surface relatively far away from the organic light emitting component, a first nano silver electrode layer, disposed on the lower surface of the third insulating layer, and a second nano silver electrode layer, disposed on the upper surface of the third insulating layer.

In one embodiment of the present invention, the third insulating layer is composed of flexible materials, and the flexible materials are selected from a group consisting of epoxy, modified epoxy, polyester, acrylic, fluorocarbon polymers, polyphenylene oxide, polyimide, phenolic resins, polysulfones, silicone-polymer resin, BT resin, cyanate poly polyethylene, polycarbonate resin, acrylonitrile-butadiene-styrene copolymer, polyethylene terephthalate, polyethylene terephthalate, polybutylene terephthalate, liquid crystal polymers, polyamides, nylon 6, copolymerized formaldehyde, polyphenylene sulfide and cyclic olefin copolymer.

In one embodiment of the present invention, the organic light emitting component is an organic light-emitting display device.

The present invention combines the nano silver sensing layer and the organic light emitting component into a touch panel, lightened and thinned the large-size touch panel, on the other hand, the nano silver sensing layer has great conductivity, to achieve the demands for rapid scanning in a large-size product.

These and other objectives of the present invention will no doubt become obvious to those of ordinary skill in the art after reading the following detailed description of the preferred embodiment that is illustrated in the various figures and drawings.

DETAILED DESCRIPTION OF THE INVENTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
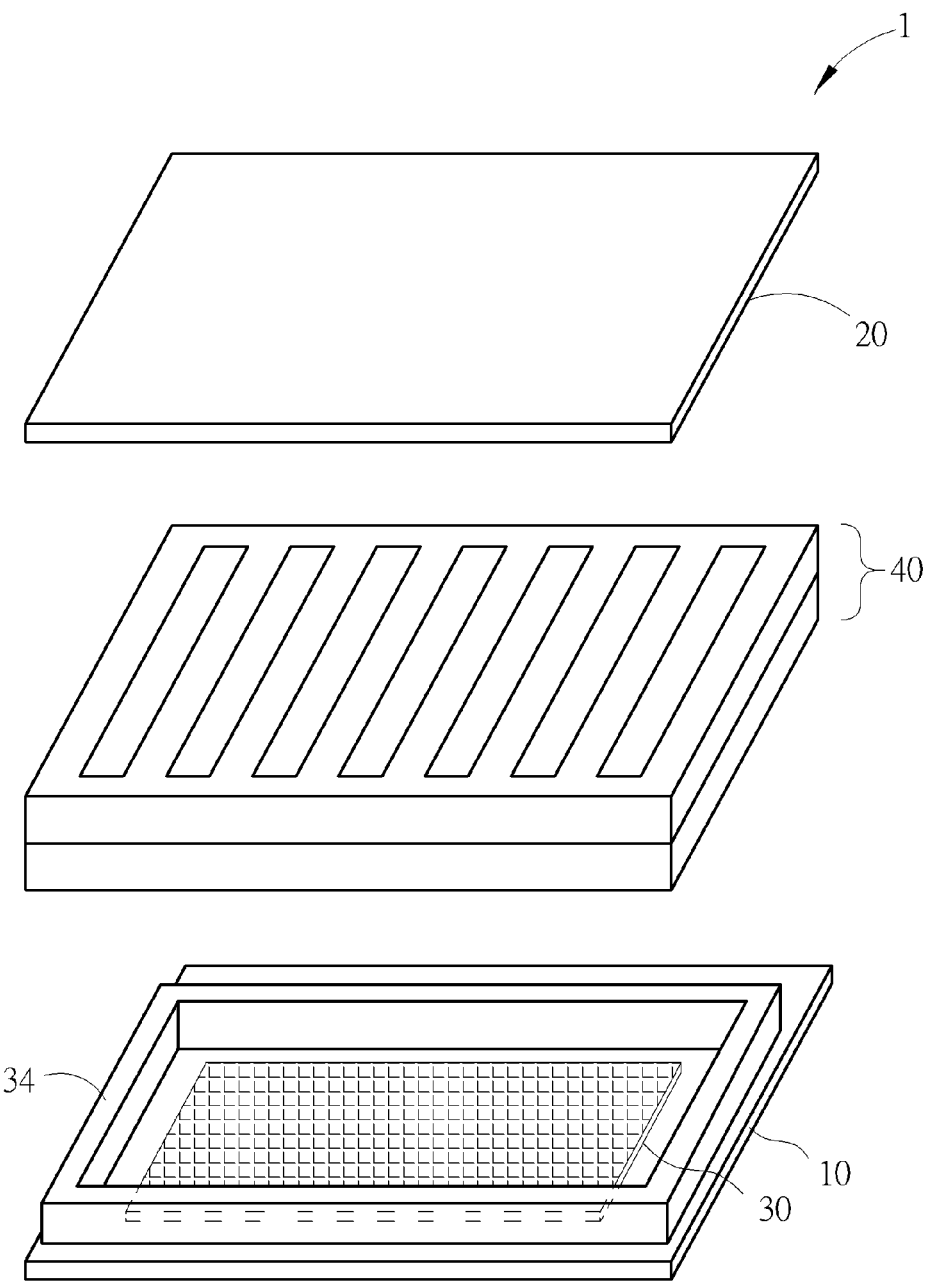
FIG. 1 is a schematic diagram showing the touch panel according to the first preferred embodiment of the present invention.

FIG. 1 is a schematic diagram showing the touch panel according to the first preferred embodiment of the present invention. As shown in FIG. 1, a touch panel 1 comprises a lower substrate 10 and an upper substrate 20. Between the lower substrate 10 and the upper substrate 20, an organic light emitting component 30 and a nano silver sensing layer 40 are disposed on the organic light emitting component 30. The lower substrate 10 provides the function for loading the organic light emitting component 30. The upper substrate 20 provides the interactive interface with the user, and the upper substrate 20 further packages and protects the organic light emitting component 30 and the nano silver sensing layer 40. With the organic light emitting component 30 such as an organic light emitting display (OLED), the structure and the principle of OLED are well known to persons of ordinary skills in the art and the details will be omitted for brevity.

In this embodiment, a transparent adhesion layer is disposed between the organic light emitting component 30 and the nano silver sensing layer 40. The transparent adhesion layer covers the organic light emitting component 30, isolates the organic light emitting component 30 from contacting oxygen and humidity, and avoids decreasing the expectancy of the organic light emitting component 30 caused by moisture or oxidation, so the transparent adhesion layer can protect and package the organic light emitting component 30, but this is done without influencing the display of the organic light emitting component 30. A sealant 34 is disposed within the periphery region of the lower substrate 10, surrounding the transparent adhesion layer and the nano silver sensing layer 40, and attaching the lower substrate 10 and the upper substrate 20 to each other, to avoid the exudation of the transparent adhesion layer and further protect and package the organic light emitting component 30.

Figure 2:
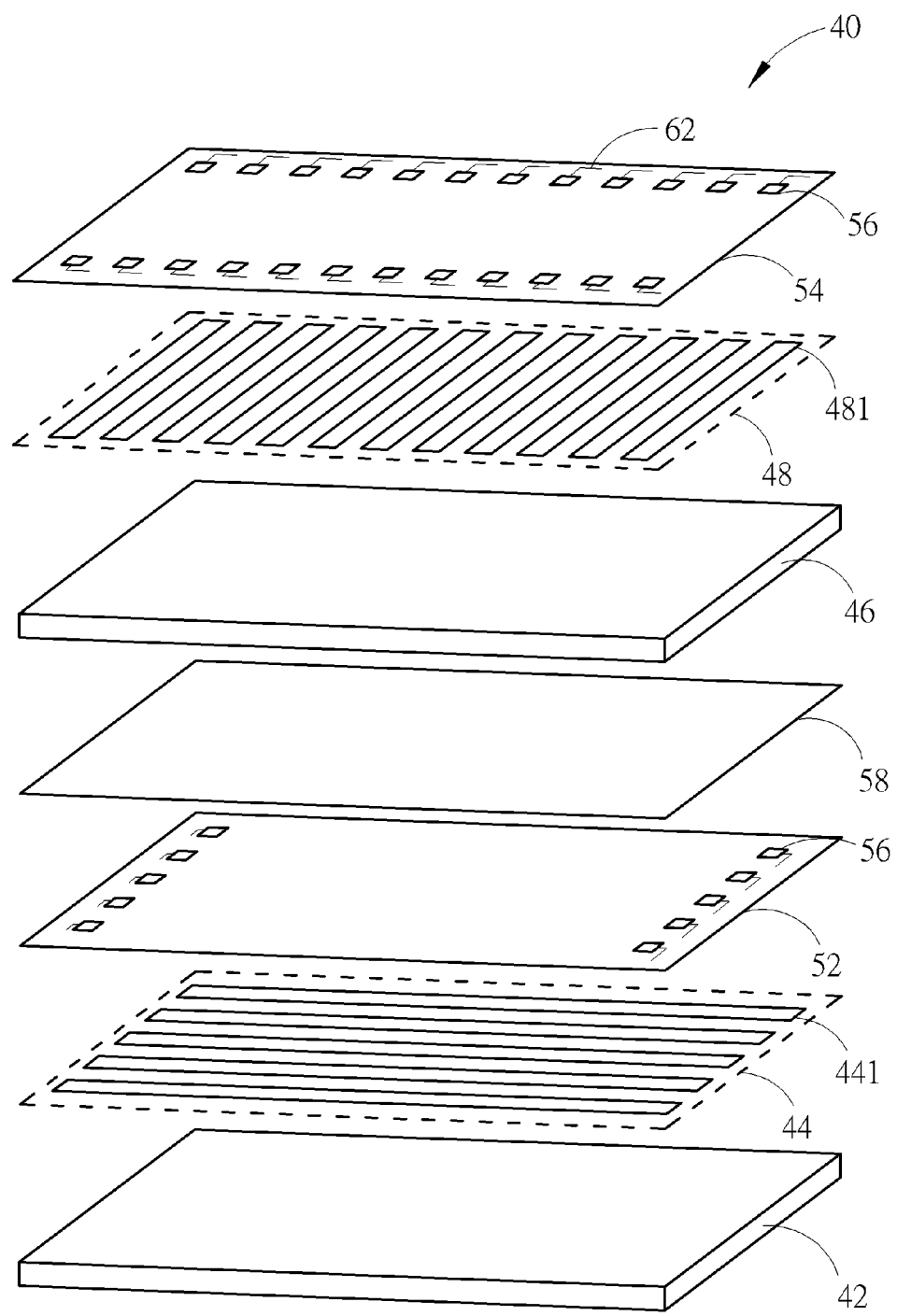
FIG. 2 is a schematic diagram showing the nano silver sensing layer of FIG. 1.

FIG. 2 is a schematic diagram showing the nano silver sensing layer 40 of FIG. 1, as shown in FIG. 2, the nano silver sensing layer 40 is a stacked structure, including a first insulating layer 42, a first nano silver electrode layer 44, a second insulating layer 46 and a second nano silver electrode layer 48, wherein the first nano silver electrode layer 44 is disposed on the surface of the first insulating layer 42, the second insulating layer 46 is disposed on the first nano silver electrode layer 44, and the second nano silver electrode layer 48 is disposed on the second insulating layer 46. More precisely, the first nano silver electrode layer 44 includes a plurality of striped-shaped first electrodes 441 arranged along a first direction and parallel to each other, the second nano silver electrode layer 48 includes a plurality of striped-shaped second electrodes 481 arranged along a second direction and parallel to each other. The first electrodes 441 and the second electrodes 481 are crossed to each other.

The material of the first insulating layer 42 and the second insulating layer 46 is selected from a group consisting of epoxy, modified epoxy, polyester, acrylic, fluorocarbon polymers, polyphenylene oxide, polyimide, phenolic resins, polysulfones, silicone-polymer resin, BT resin, cyanate poly polyethylene, polycarbonate resin, acrylonitrile-butadiene-styrene copolymer, polyethylene terephthalate, polyethylene terephthalate, polybutylene terephthalate, liquid crystal polymers, polyamides, nylon 6, copolymerized formaldehyde, polyphenylene sulfide and cyclic olefin copolymer. The materials mentioned above are transparent and flexible, suitable for using as the material for forming a large size and flexible touch panel. Besides, the first insulating layer 42 and the second insulating layer 46 are lighter and thinner than glass, so the weight and the thickness of the touch panel can be decreased effectively. The first nano silver electrode layer 44 and the second nano silver electrode layer 48 have great transmittance, flexibility and conductivity, thereby achieving the demands for having high transmittance in touch panel products, and can be formed on the flexible first insulating layer 42 and the flexible second insulating layer 46 easily, so as to achieve the demands for rapid scanning frequency in a large-size touch panel. In the present invention, the conductivity of the first nano silver electrode layer 44 and the second nano silver electrode layer 48 can be adjusted by controlling the concentration of the nano silver liquid during the manufacturing process. In other words, the first nano silver electrode layer 44 and the second nano silver electrode layer 48 with lower resistance can be formed through increasing the concentration of the nano silver liquid. The nano silver (including first nano silver electrode layer 44 and the second nano silver electrode layer 48) can be formed on the first insulating layer 42 and the second insulating layer 46 respectively through a sputtering, a printing or a lithography etching process. It should be understood that the electrode pattern and the arrangement direction of the first electrodes 441 and the second electrodes 481 are not limited, and can be adjusted according to actual requirements, any symmetry and repeated patterns can be arranged in regular.

In this embodiment, the touch panel further comprises a first protection layer 52 covering on the first nano silver electrode layer 44, and a second protection layer 54 covering on the second nano silver electrode layer 48, to prevent the first nano silver electrode layer 44 and the second nano silver electrode layer 48 from contacting with air and experiencing oxidation. Besides, the first protection layer 52 and the second protection layer 54 comprise a plurality of via holes 56 disposed corresponding to the end portions of each first electrode 441 and each second electrode 481, to expose parts of each first electrode 441 and parts of each second electrode 481. Within the periphery region of the first protection layer 52 and the second protection layer 54, a plurality of traces 62 are disposed, wherein one terminal of each trace 62 is electrically connected to the corresponding first electrode 441 or the corresponding second electrode 481 through the via holes 56, and another terminal of each trace 62 is electrically connected to a controller (not shown) disposed outside, to transfer the signals from the touch panel to the controller. It is worth noting that first protection layer 52 and the second protection layer 54 mentioned above can be a single layer structure or a multiple layer structure. In addition, the embodiment further comprises a transparent adhesion layer 58 disposed between the first protection layer 52 and the second insulating layer 46, to attach them to each other. The first preferred embodiment of the present invention combines the nano silver sensing layer 40 and the organic light emitting component 30 into a touch panel, to meet the market requirements for a lightened and thinned touch panel. On the other hand, nano silver is used to replace conventional ITO to form the electrode. Since the flexibility of the nano silver is better than the flexibility of friable ITO, the first nano silver electrode layer 44 and the second nano silver electrode layer 48 can be easily crossed stacked on flexible substrate (such as PET), besides, the weight of touch panel can be decreased too. In addition, since the nano silver has low resistance, it can achieve the demands for rapid scanning in a large-size product. In addition, expect for the transparent adhesion, the nano silver sensing layer 40 and the upper substrate 20 are also disposed on the organic light emitting component 30 to further protect the organic light emitting component 30 from oxidation and humidity.

The following description will detail the different embodiments of the nano silver sensing layer of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
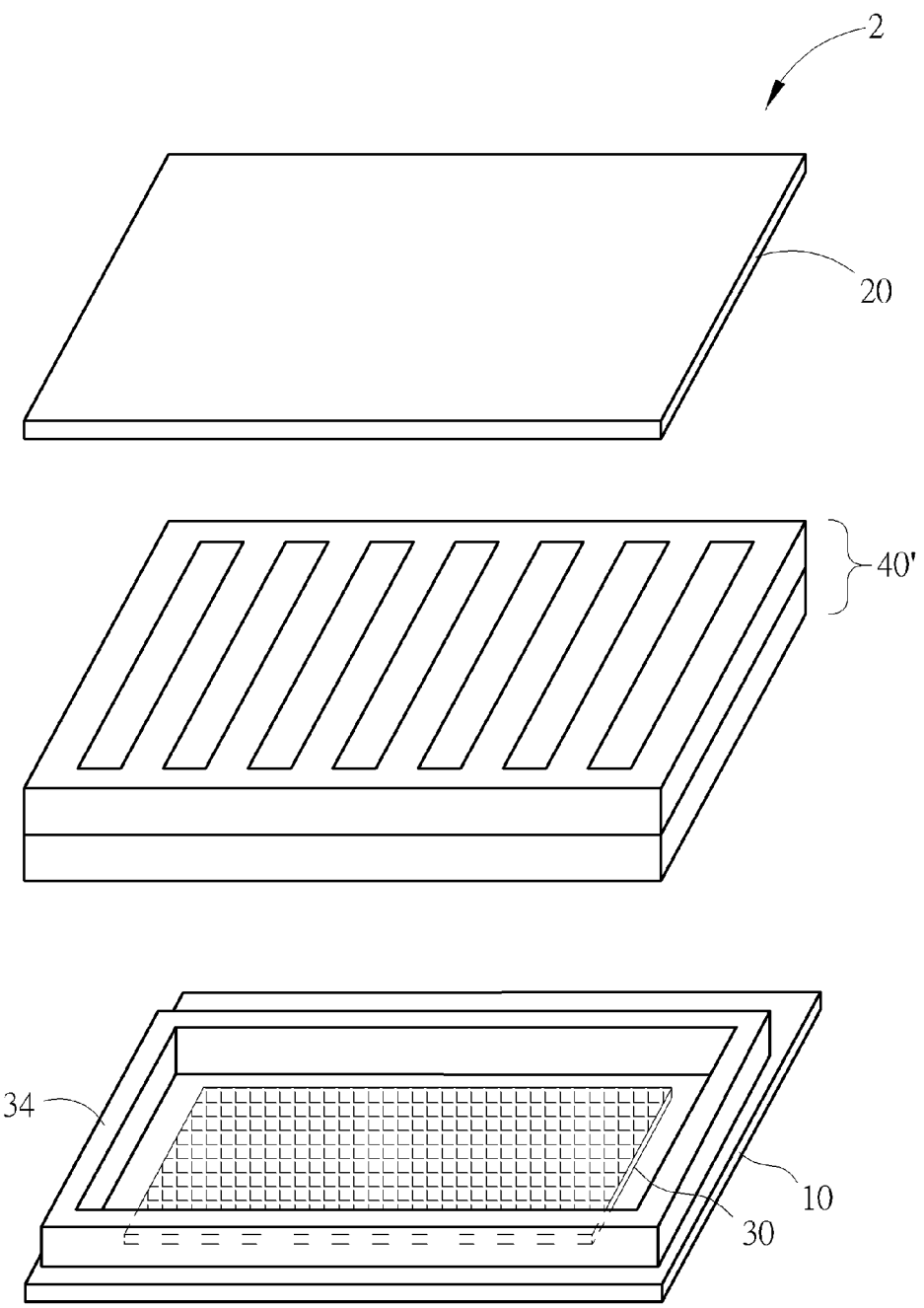
FIG. 3 is a schematic diagram showing the touch panel according to the second preferred embodiment of the present invention.

FIG. 3 is a schematic diagram showing the touch panel according to the second preferred embodiment of the present invention, as shown in FIG. 3, similar with the first preferred embodiment, a touch panel 2 comprises a lower substrate 10 and an upper substrate 20. Between the lower substrate 10 and the upper substrate 20, the touch panel of this embodiment further comprises an organic light emitting component 30 and a nano silver sensing layer 40' disposed on the organic light emitting component 30. The lower substrate 10 provides the function for loading the organic light emitting component 30. The upper substrate 20 provides the interactive interface with user, and the upper substrate 20 further protects and packages the organic light emitting component 30 and the nano silver sensing layer 40'. In this embodiment, a transparent adhesion layer is disposed between the organic light emitting component 30 and the nano silver sensing layer 40'. The transparent adhesion layer can protect and package the organic light emitting component 30 from contacting oxygen and humidity, and to avoid decreasing the expectancy of the organic light emitting component 30 caused by moisture or oxidation, but without influencing the display of the organic light emitting component 30. A sealant 34 is disposed on the periphery region of the lower substrate 10, surrounding the transparent adhesion layer and the nano silver sensing layer 40', and attaching the lower substrate 10 and the upper substrate 20 to each other, to avoid the exudation of the transparent adhesion layer, and further protect and package the organic light emitting component 30.

Figure 4:
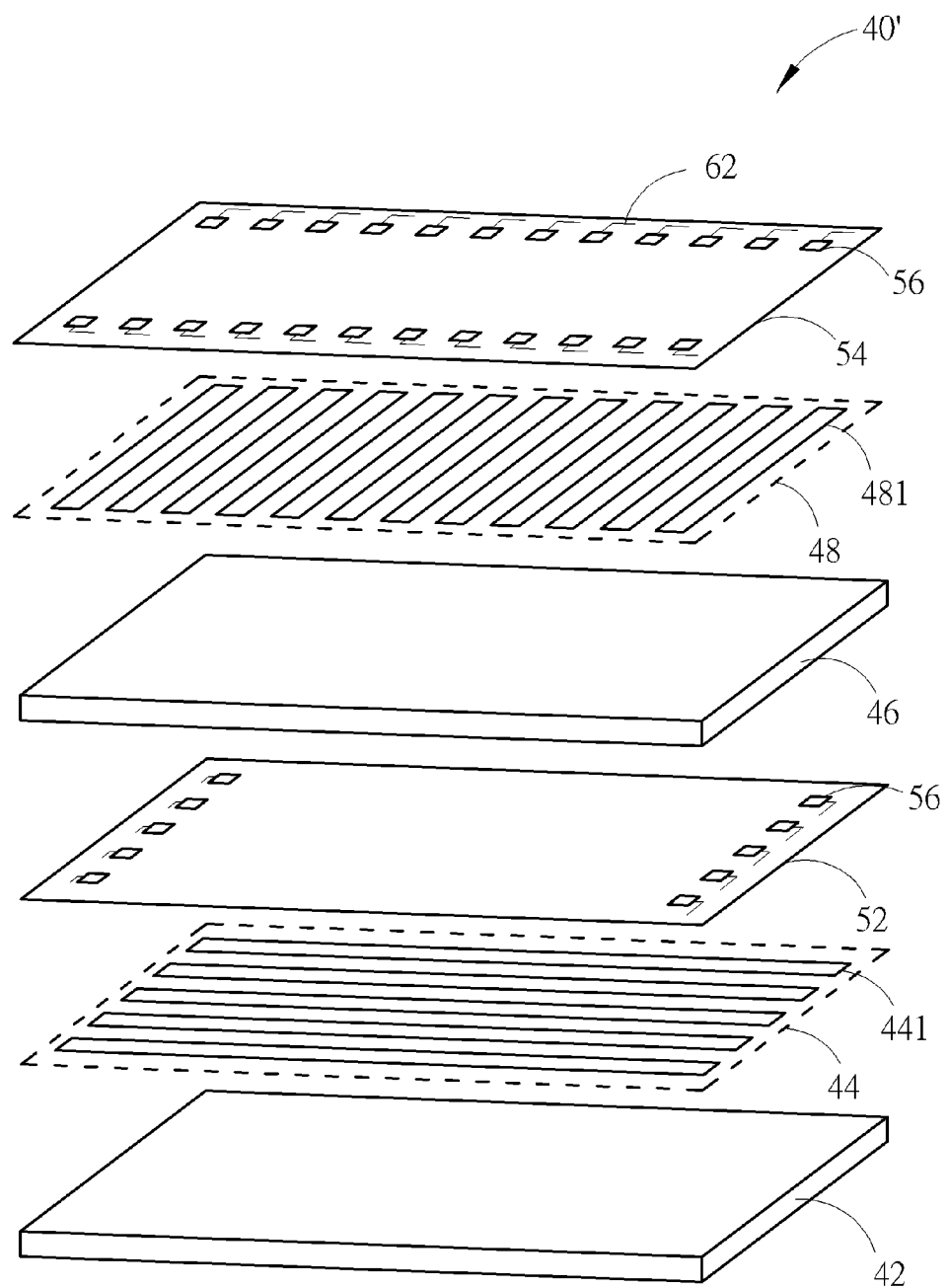
FIG. 4 is a schematic diagram showing the nano silver sensing layer of FIG. 3.

In this embodiment, the structure of the nano silver sensing layer 40' is different from the nano silver sensing layer 40 in the first preferred embodiment. Please refer to FIG. 4. FIG. 4 is a schematic diagram showing the nano silver sensing layer 40' of FIG. 3. The nano silver sensing layer 40' includes a first insulating layer 42, a first nano silver electrode layer 44, a second insulating layer 46 and a second nano silver electrode layer 48, wherein the first nano silver electrode layer 44 is disposed on the surface of the first insulating layer 42, the second insulating layer 46 is disposed on the first nano silver electrode layer 44, and the second nano silver electrode layer 48 is disposed on the second insulating layer 46. The first nano silver electrode layer 44 includes a plurality of striped-shaped first electrodes 441 arranged along a first direction and parallel to each other, the second nano silver electrode layer 48 includes a plurality of striped-shaped second electrodes 481 arranged along a second direction and parallel to each other. In addition, this embodiment further comprises a first protection layer 52 disposed on the first nano silver electrode layer 44, and a second protection layer 54 disposed on the second nano silver electrode layer 48, to prevent the first nano silver electrode layer 44 and the second nano silver electrode layer 48 from contacting with air and experiencing oxidation. Besides, the first protection layer 52 and the second protection layer 54 comprise a plurality of via holes 56 disposed corresponding to the end portion of each first electrode 441 and each second electrode 481, to expose parts of each first electrode 441 and parts of each second electrode 481. Within the periphery region of the first protection layer 52 and the second protection layer 54, a plurality of traces 62 are disposed, wherein one terminal of each trace 62 is electrically connected to the corresponding first electrode 441 or the corresponding second electrode 481 through the via holes 56, and another terminal of each trace 62 is electrically connected to a controller (not shown) disposed outside, to transfer the signals from the touch panel to the controller. It is worth noting that first protection layer 52 and the second protection layer 54 mentioned above can be a single layer structure or a multiple layer structure. In this embodiment, the second insulating layer 46 is directly formed on the first protection layer 52, and without forming the transparent adhesion layer. The other components, material properties, and manufacturing method of the touch panel 2 are similar to the first preferred embodiment detailed above and will not be described repeatedly.

Figure 5:
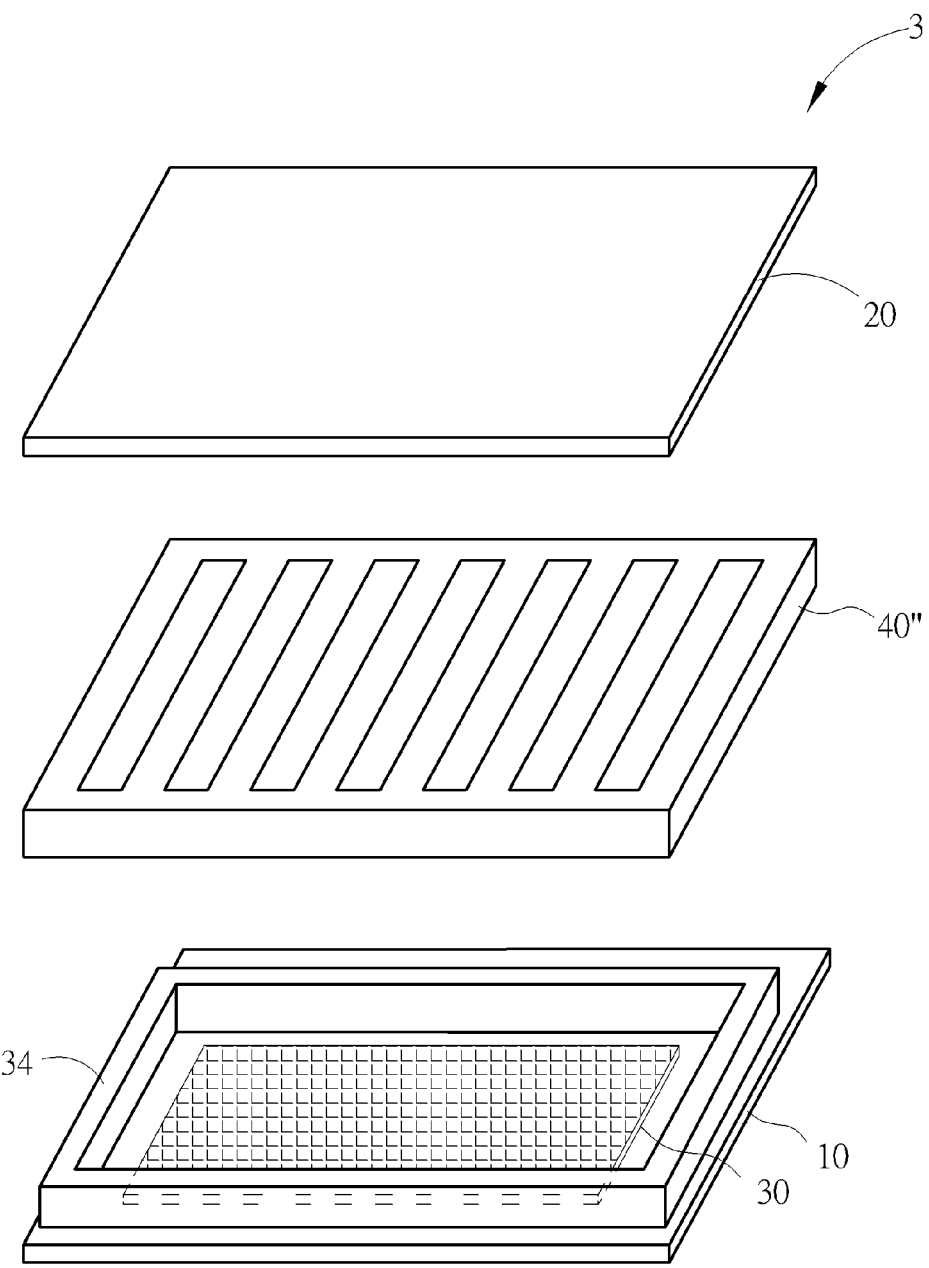
FIG. 5 is a schematic diagram showing the touch panel according to the third preferred embodiment of the present invention.
Figure 6:
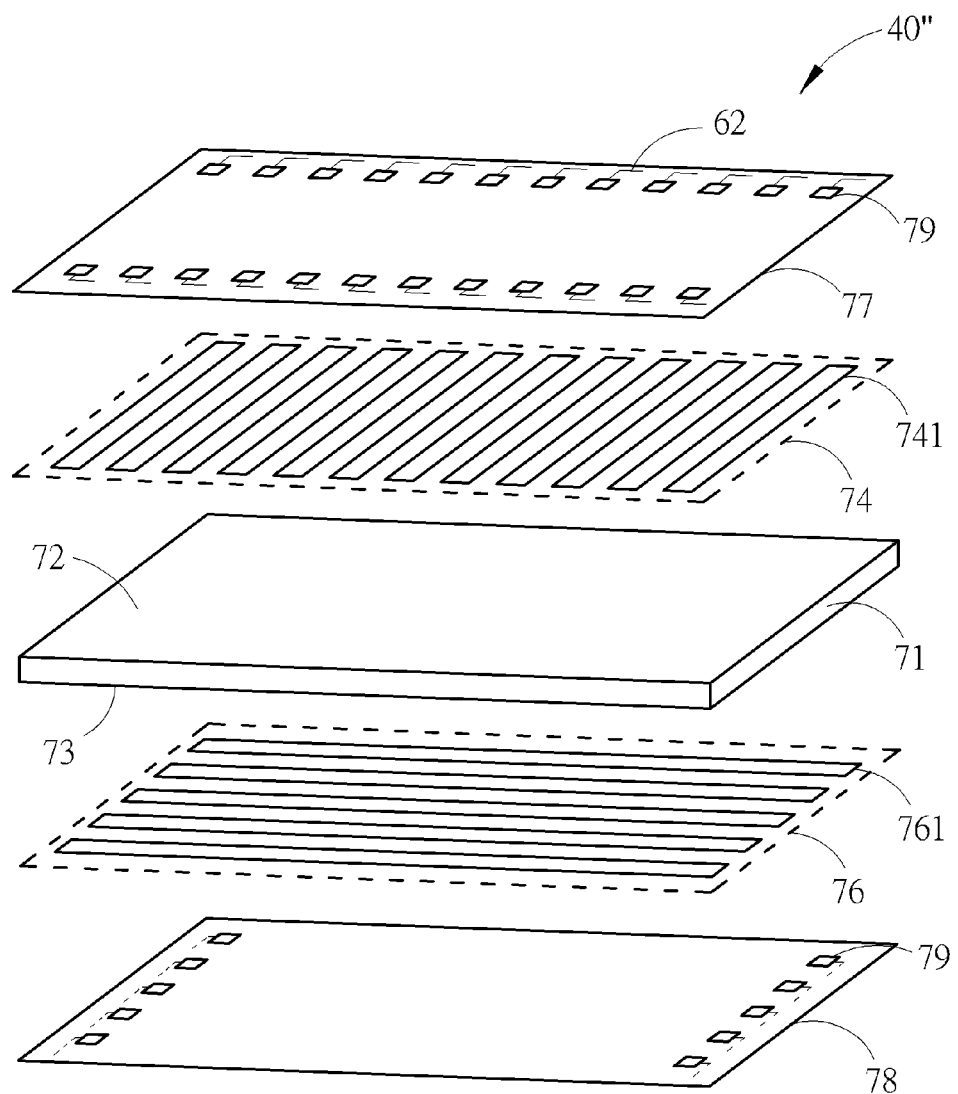
FIG. 6 is a schematic diagram showing the nano silver sensing layer of FIG. 5.

FIG. 5 is a schematic diagram showing the touch panel according to the third preferred embodiment of the present invention. As shown in FIG. 5, similar with the first preferred embodiment, a touch panel 3 comprises a lower substrate 10 and an upper substrate 20. Between the lower substrate 10 and the upper substrate 20, the touch panel of this embodiment further comprises an organic light emitting component 30 and a nano silver sensing layer 40" disposed on the organic light emitting component 30. The lower substrate 10 provides the function for loading the organic light emitting component 30. The upper substrate 20 provides the interactive interface with user, and the upper substrate 20 further protects and packages the organic light emitting component 30 and the nano silver sensing layer 40". In this embodiment, a transparent adhesion layer is disposed between the organic light emitting component 30 and the nano silver sensing layer 40", covering the organic light emitting component 30. Besides, a sealant 34 is disposed on the periphery region of the lower substrate 10, surrounding the transparent adhesion layer and the nano silver sensing layer 40", and attaching the lower substrate 10 and the upper substrate 20 to each other, to avoid the exudation of the transparent adhesion layer, and further protect and package the organic light emitting component 30. In this embodiment, the structure of the nano silver sensing layer 40" is different from the nano silver sensing layer 40 in the first preferred embodiment. Please refer to FIG. 6, FIG. 6 is a schematic diagram showing the nano silver sensing layer 40" of FIG. 5. The nano silver sensing layer 40" comprises a third insulating layer 71, having an upper surface 72 relatively far away from the organic light emitting component 30 and a lower surface 73 relatively closer to the organic light emitting component 30, a first nano silver electrode layer 74 disposed on the upper surface 72, a second nano silver electrode layer 76 disposed on the lower surface 73. The first nano silver electrode layer 74 includes a plurality of striped-shaped first electrodes 741 arranged along a first direction and parallel to each other. The second nano silver electrode layer 76 includes a plurality of striped-shaped second electrodes 761 arranged along a second direction and parallel to each other. The first electrodes 741 and the second electrodes 761 are crossed to each other. Similarly, a third protection layer 77 and a fourth protection layer 78 are formed on the first nano silver electrode layer 74 and on the second nano silver electrode layer 76 respectively, to prevent the first nano silver electrode layer 74 and the second nano silver electrode layer 76 from experiencing oxidation. The third protection layer 77 and the fourth protection layer 78 comprise a plurality of via holes 79 disposed corresponding to the end portion of each first electrode 741 and each second electrode 761, to expose parts of each first electrode 741 and parts of each second electrode 761. It is worth noting that third protection layer 77 and the fourth protection layer 78 mentioned above can be a single layer structure or a multiple layer structure. Besides, within the periphery region of the third protection layer 77 and the fourth protection layer 78, a plurality of traces 62 are disposed, wherein one terminal of each trace 62 is electrically connected to the corresponding first electrode 741 or the corresponding second electrode 761 through the via holes 79, and another terminal of each trace 62 is electrically connected to a controller (not shown) disposed outside, to transfer the signals from the touch panel to the controller.

In this embodiment, the material of the third insulating layer 71 can be selected from the flexible materials, similar with the first preferred embodiment or the second preferred embodiment, it can be selected from a group of epoxy, modified epoxy, polyester, acrylic, fluorocarbon polymers, polyphenylene oxide, polyimide, phenolic resins, polysulfones, silicone-polymer resin, BT resin, cyanate poly polyethylene, polycarbonate resin, acrylonitrile-butadiene-styrene copolymer, polyethylene terephthalate, polyethylene terephthalate, polybutylene terephthalate, liquid crystal polymers, polyamides, nylon 6, copolymerized formaldehyde, polyphenylene sulfide and cyclic olefin copolymer. Furthermore, the arrangement direction of the first electrode 741 and the second electrode 761 are not limited by the embodiment mentioned above, and can be adjusted according to actual requirements, any symmetry and repeated patterns can be arranged regularly.

In the third embodiment of the present invention, the nano silver sensing layer 40" only comprises single insulating layer, the first nano silver electrode layer 74 and the second nano silver electrode layer 76 are disposed on the upper surface 72 and on the lower surface 73 of the third insulating layer 71 respectively, thereby decreasing the weight and the thickness of the touch panel. Besides, the nano silver is used as the material for forming the first nano silver electrode layer 74 and the second nano silver electrode layer 76, to achieve the demands for high transmittance and rapid scanning in a large-size product. In addition, the first nano silver electrode layer 74 and the second nano silver electrode layer 76 can be conformally formed on the third insulating layer 71. The other components, material properties, and manufacturing method of the touch panel 3 are similar to the first preferred embodiment detailed above and will not be redundantly described.

In summary, the present invention combines the touch panel and the display device into one structure, to achieve the requirement for forming a lightened and thinned touch panel. On the other hand, the nano silver is used to replace the ITO to form the electrodes, since the nano silver has better flexibility and conductivity than ITO, it can be formed on flexible substrate (such as PET) easily, and achieve the demands for rapid scanning in a large-size product. By adjusting the concentration of the nano silver liquid, the conductivity of the nano silver electrodes therefore can be adjusted, so the flexible, large-size and having low resistance electrodes touch panel can be made. Besides, except for the transparent adhesion, the nano silver sensing layer and the upper substrate are also disposed on the organic light emitting component, wherein the nano silver sensing layer further comprises the insulating layer, to protect the organic light emitting component, therefore increasing the stability of the touch panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel, comprising:
   a lower substrate;
   an organic light-emitting component disposed on the lower substrate;
   a nano silver sensing layer disposed on the organic light emitting component, wherein the nano silver sensing layer comprises:
   a third insulating layer disposed on the organic light emitting component, wherein the third insulating layer has a lower surface facing the organic light emitting component and an upper surface facing away from the organic light emitting component;
   a second nano silver electrode layer disposed on the lower surface of the third insulating layer; and
   a first nano silver electrode layer disposed on the upper surface of the third insulating layer;
   an upper substrate disposed on the nano silver sensing layer;
   a third protection layer formed on the first nano silver electrode layer; and
   a fourth protection layer formed under the second nano silver electrode layer.

2. The touch panel of claim 1, wherein the third insulating layer is composed of flexible materials, and the flexible materials are selected from the group consisting of epoxy, modified epoxy, polyester, acrylic, fluorocarbon polymers, polyphenylene oxide, polyimide, phenolic resins, polysulfones, silicone-polymer resin, BT resin, cyanate poly polyethylene, polycarbonate resin, acrylonitrile-butadiene-styrene copolymer, polyethylene terephthalate, polyethylene terephthalate, polybutylene terephthalate, liquid crystal polymers, polyamides, nylon 6, copolymerized formaldehyde, polyphenylene sulfide and cyclic olefin copolymer.

3. The touch panel of claim 1, further comprising a transparent adhesion layer disposed between the organic light emitting component and the first nano silver electrode layer.

4. The touch panel of claim 1, wherein the first nano silver electrode layer comprises a plurality of first electrodes arranged along a first direction and parallel to each other, and the second nano silver electrode layer comprises a plurality of second electrodes arranged along a second direction and parallel to each other.

5. The touch panel of claim 4, wherein the plurality of first electrodes and the plurality of the second electrodes cross each other.

6. The touch panel of claim 4, wherein the plurality of first electrodes are striped-shaped.

7. The touch panel of claim 4, wherein the plurality of second electrodes are striped-shaped.

8. The touch panel of claim 1, wherein the third protection layer is a single layer structure or a multiple layer structure.

9. The touch panel of claim 1, wherein the fourth protection layer is a single layer structure or a multiple layer structure.

10. The touch panel of claim 1, wherein the third protection layer comprises a plurality of first via holes to expose a plurality of first electrodes of the first nano silver electrode layer, and the fourth protection layer comprises a plurality of second via holes to expose a plurality of second electrodes of the second nano silver electrode layer.

11. The touch panel of claim 10, further comprising a plurality of first traces and a plurality of second traces, wherein each first trace of the plurality of first traces electrically connects to a corresponding first electrode of the plurality of first electrodes through a corresponding first via hole of the plurality of first via holes, and each second trace of the plurality of second traces electrically connects a corresponding second electrode of the plurality of second electrodes through a corresponding second via hole of the plurality of second via holes.

12. The touch panel of claim 1, wherein the organic light emitting component is an organic light-emitting display device.

13. The touch panel of claim 3, further comprising:
a sealant disposed within a periphery region of the lower substrate and surrounding the transparent adhesion layer and the nano silver sensing layer, wherein the sealant attaches the lower substrate to the upper substrate.

14. The touch panel of claim 1, further comprising:
a sealant disposed between the lower substrate and the upper substrate wherein the sealant is surrounding the nano silver sensing layer and the organic light-emitting component.

15. The touch panel of claim 10, wherein each first via hole of the plurality of first via holes is disposed to expose an end portion of a corresponding first electrode of the plurality of first electrodes.

16. The touch panel of claim 10, wherein each second via hole of the plurality of second via holes is disposed to expose an end portion of a corresponding second electrode of the plurality of second electrodes.

* * * * *